(12) United States Patent
Washington et al.

(10) Patent No.: US 7,534,714 B2
(45) Date of Patent: May 19, 2009

(54) RADIAL TEMPERATURE CONTROL FOR LATTICE-MISMATCHED EPITAXY

(75) Inventors: Lori Washington, Union City, CA (US); Sandeep Nijhawan, Los Altos, CA (US); David Carlson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 313 days.

(21) Appl. No.: 11/418,634

(22) Filed: May 5, 2006

(65) Prior Publication Data
US 2007/0259535 A1 Nov. 8, 2007

(51) Int. Cl.
*H01L 21/28* (2006.01)
*H01L 21/3205* (2006.01)
(52) U.S. Cl. .................. 438/604; 438/483; 438/486; 438/509; 257/E21.172

(58) Field of Classification Search .................. 438/604, 438/791, 637, 638, 483, 486, 509, FOR. 264, 438/FOR. 474; 257/E21.579, E21.085, E21.697, 257/E33.023, E31.019, E27.012, E29.089, 257/E29.144, E21.172
See application file for complete search history.

(56) References Cited

U.S. PATENT DOCUMENTS

| | | | |
|---|---|---|---|
| 2001/0008656 A1* | 7/2001 | Tischler et al. | 428/34.1 |
| 2002/0166502 A1* | 11/2002 | Vaudo et al. | 117/89 |
| 2004/0224484 A1* | 11/2004 | Fareed et al. | 438/478 |
| 2004/0255840 A1* | 12/2004 | Dwilinski et al. | 117/2 |
| 2005/0242364 A1* | 11/2005 | Moustakas et al. | 257/103 |

* cited by examiner

*Primary Examiner*—Michelle Estrada
(74) *Attorney, Agent, or Firm*—Townsend and Townsend and Crew LLP (57) ABSTRACT

Methods are disclosed of fabricating a compound nitride semiconductor structure. A substrate is disposed over a susceptor in a processing chamber, with the susceptor in thermal communication with the substrate. A group-III precursor and a nitrogen precursor are flowed into the processing chamber. The susceptor is heated with a nonuniform temperature profile to heat the substrate. A nitride layer is deposited over the heated substrate with a thermal chemical vapor deposition process within the processing chamber using the group-III precursor and the nitrogen precursor.

19 Claims, 4 Drawing Sheets

RADIAL TEMPERATURE CONTROL FOR LATTICE-MISMATCHED EPITAXY

BACKGROUND OF THE INVENTION

The history of light-emitting diodes ("LEDs") is sometimes characterized as a "crawl up the spectrum." This is because the first commercial LEDs produced light in the infrared portion of the spectrum, followed by the development of red LEDs that used GaAsP on a GaAs substrate. This was, in turn, followed by the use of GaP LEDs with improved efficiency that permitted the production of both brighter red LEDs and orange LEDs. Refinements in the use of GaP then permitted the development of green LEDs, with dual GaP chips (one in red and one in green) permitting the generation of yellow light. Further improvements in efficiency in this portion of the spectrum were later enabled through the use of GaAlAsP and InGaAlP materials.

This evolution towards the production of LEDs that provide light at progressively shorter wavelengths has generally been desirable not only for its ability to provide broad spectral coverage but because diode production of short-wavelength light may improve the information storage capacity of optical devices like CD-ROMs. The production of LEDs in the blue, violet, and ultraviolet portions of the spectrum was largely enabled by the development of nitride-based LEDs, particularly through the use of GaN. While some modestly successful efforts had previously been made in the production of blue LEDs using SiC materials, such devices suffered from poor luminescence as a consequence of the fact that their electronic structure has an indirect bandgap.

While the feasibility of using GaN to create photoluminescence in the blue region of the spectrum has been known for decades, there were numerous barriers that impeded their practical fabrication. These included the lack of a suitable substrate on which to grow the GaN structures, generally high thermal requirements for growing GaN that resulted in various thermal-convection problems, and a variety of difficulties in efficient p-doping such materials. The use of sapphire as a substrate was not completely satisfactory because it provides approximately a 15% lattice mismatch with the GaN. Progress has subsequently been made in addressing many aspects of these barriers. For example, the use of a buffer layer of AlN or GaN formed from a metalorganic vapor has been found effective in accommodating the lattice mismatch. Further refinements in the production of GaN-based structures has included the use of AlGaN materials to form heterojunctions with GaN and particularly the use of InGaN, which causes the creation of defects that act as quantum wells to emit light efficiently at short wavelengths. Indium-rich regions have a smaller bandgap than surrounding material, and may be distributed throughout the material to provide efficient emission centers.

While some improvements have thus been made in the manufacture of such compound nitride semiconductor devices, it is widely recognized that a number of deficiencies yet exist in current manufacturing processes. Moreover, the high utility of devices that generate light at such wavelengths has caused the production of such devices to be an area of intense interest and activity. In view of these considerations, there is a general need in the art for improved methods and systems for fabricating compound nitride semiconductor devices.

BRIEF SUMMARY OF THE INVENTION

Embodiments of the invention provide methods of fabricating structures, including compound nitride semiconductor structures. In a first set of embodiments, methods are provided of fabricating a compound nitride semiconductor structure. A substrate is disposed over a susceptor in a processing chamber, with the susceptor in thermal communication with the substrate. A first group-III precursor and a first nitrogen precursor are flowed into the processing chamber. The first group-III precursor comprises a first group-III element. The susceptor is heated with a first nonuniform temperature profile to heat the substrate while flowing the first group-III precursor and the first nitrogen precursor. A first nitride layer is deposited over the heated substrate with a thermal chemical vapor deposition process within the processing chamber using the first group-III precursor and the first nitrogen precursor.

In some instances, a second nitride layer is deposited after depositing the first nitride layer. A second group-III precursor and a second nitrogen precursor are flowed into the processing chamber. The second group-III precursor comprises a second group-III element. The susceptor is heated with a second nonuniform temperature profile to heat the substrate while flowing the second group-III precursor and the second nitrogen precursor. The second nitride layer is deposited over the first nitride layer and over the heated substrate with a thermal chemical vapor deposition process within the processing chamber using the second group-III precursor and the second nitrogen precursor. The second group-III element may be different from the first group-III element. The second nitride layer may have a different coefficient of thermal expansion than the first nitride layer. The second nonuniform temperature profile may be different from the first nonuniform temperature profile. In such cases, the first nonuniform temperature profile may be changed smoothly to the second nonuniform temperature profile.

Specific examples of layers include those in which the first group-III element is gallium and the second group-III element is aluminum, permitting the first nitride layer to comprise a GaN layer and the second nitride layer to comprise an AlGaN layer. In another example, the first group-III element is gallium and the second group-III element is indium, in which case the first nitride layer may comprise a GaN layer and the second nitride layer may comprise an InGaN layer. In a further example, the first group-III element is gallium and the second group-III element includes aluminum and indium so that the first nitride layer comprises a GaN layer and the second nitride layer comprises an AlInGaN layer.

A carrier gas may sometimes be flowed with the first group-III precursor and the first nitrogen precursor. Examples of suitable carrier gases include $N_2$ and $H_2$. The substrate and the first nitride layer may have different coefficients of thermal expansion. Examples of suitable substrates include a sapphire substrate, a SiC substrate, a silicon substrate, a spinel substrate, a lithium gallate substrate, and a ZnO substrate.

In certain embodiments, the susceptor is heated radiatively with a lamp array, which comprises a plurality of radiative lamp elements. For example, each of the lamp elements within a first annular region of the lamp array may be activated with a first power and each of the lamp elements within a second annular region of the lamp array may be activated with a second power different from the first power. The susceptor may alternatively be heated by selectively directing heat from the lamp elements to different portions of the susceptor with a reflector configuration. The first nonuniform temperature profile may heat a center of the susceptor to a temperature greater than an edge of the susceptor.

In a second set of embodiments, methods are provided of fabricating a structure. A substrate is disposed over a susceptor in a processing chamber, with the susceptor in thermal communication with the substrate. A first process gas is flowed into the processing chamber. The first process gas includes precursors for growth of a first layer over the substrate. The substrate and the first layer have different coefficients of thermal expansion. The susceptor is heated with a first nonuniform temperature profile to heat the substrate while flowing the first process gas. The first layer is deposited over the heated substrate with a thermal chemical vapor deposition process within the processing chamber using the first process gas.

After depositing the first layer, a second layer may be grown. A second process gas is flowed into the processing chamber. The second process gas includes precursors for growth of the second layer over the first layer, with the first layer and the second layer having different coefficients of thermal expansion. The susceptor is heated with a second nonuniform temperature profile different from the first nonuniform temperature profile to heat the substrate while flowing the second process gas. The second layer is deposited over the first layer and over the heated substrate with a thermal chemical vapor deposition process within the processing chamber using the second process gas. The susceptor may be heated with the second nonuniform temperature profile by smoothly changing the first nonuniform temperature profile to the second nonuniform temperature profile.

In some instances, the susceptor may be heated radiatively with a lamp array as described above.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

1. Overview

One of the difficulties mentioned above in fabricating nitride-based structures such as GaN structures is the accommodation of generally high thermal requirements for growth of GaN. Historically, this made the identification of a suitable substrate difficult, with the art more recently focusing on ways in which the use of sapphire $Al_2O_3$ may be accommodated. Sapphire is not an ideal substrate because there is a significant lattice mismatch with deposited nitride layers; in the specific case of GaN, this lattice mismatch is approximately 15%. While the use of a nitride buffer layer has been helpful in accommodating the lattice mismatch, both the lattice mismatch and other physical differences between the sapphire substrate and overlying nitride layer result in distortions of resulting structures.

Figure 1:
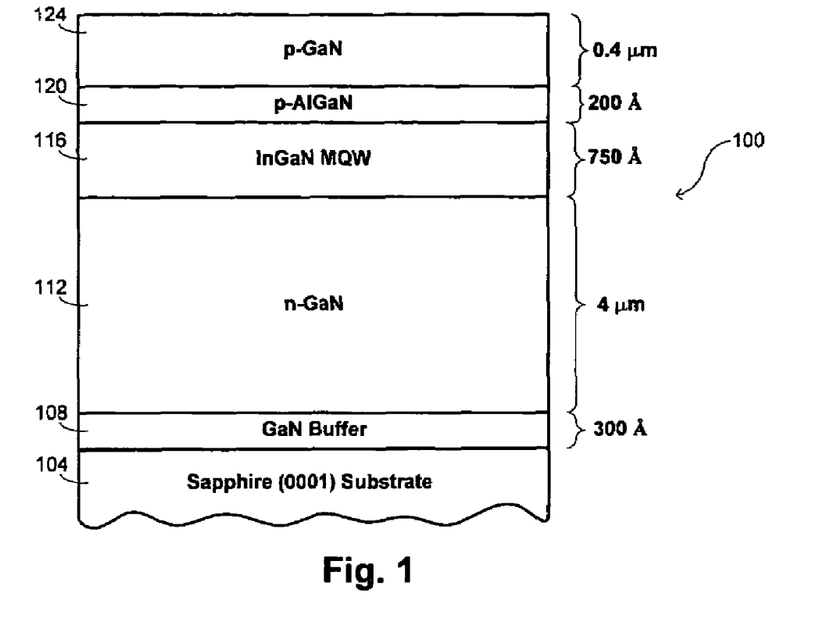
FIG. 1 provides a schematic illustration of a structure of a GaN-based LED.

One typical nitride-based structure is illustrated in FIG. 1 as a GaN-based LED structure 100. It is fabricated over a sapphire (0001) substrate 104. An n-type GaN layer 112 is deposited over a GaN buffer layer 108 formed over the substrate. An active region of the device is embodied in a multi-quantum-well layer 116, shown in the drawing to comprise an InGaN layer. A pn junction is formed with an overlying p-type AlGaN layer 120, with a p-type GaN layer 124 acting as a contact layer.

A typical fabrication process for such an LED may use a metalorganic chemical-vapor-deposition ("MOCVD") process that follows cleaning of the substrate 104 in a processing chamber. The MOCVD deposition is accomplished by providing flows of suitable precursors to the processing chamber and using thermal processes to achieve deposition. For example, a GaN layer may be deposited using Ga and N precursors, perhaps with a flow of a fluent gas like $N_2$, $H_2$, and/or $NH_3$; an InGaN layer may be deposited using Ga, N, and In precursors, perhaps with a flow of a fluent gas; and an AlGaN layer may be deposited using Ga, N, and Al precursors, also perhaps with a flow of a fluent gas. In the illustrated structure 100, the GaN buffer layer 108 has a thickness of about 300 Å, and may have been deposited at a temperature of about 550° C. Subsequent deposition of the n-GaN layer 112 is typically performed at a higher temperature, such as around 1050° C. in one embodiment. The n-GaN layer 112 is relatively thick, with deposition of a thickness on the order of 4 µm requiring about 140 minutes. The InGaN multi-quantum-well layer 116 may have a thickness of about 750 Å, which may be deposited over a period of about 40 minutes at a temperature of about 750° C. The p-AlGaN layer 120 may have a thickness of about 200 Å, which may be deposited in about five minutes at a temperature of 950° C. The thickness of the contact layer 124 that completes the structure may be about 0.4 µm in one embodiment, and may be deposited at a temperature of about 1050° C. for around 25 minutes.

Figure 2A:
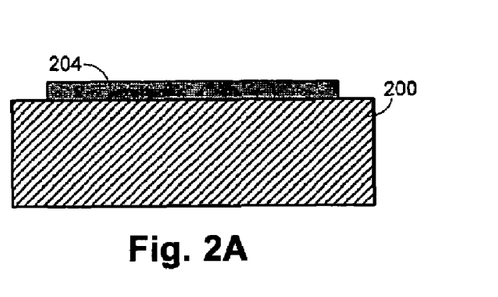
FIGS. 2A and 2B illustrate how physical differences between a substrate and material deposited on a substrate may result in shape distortions of nitride-based structures.
Figure 2B:
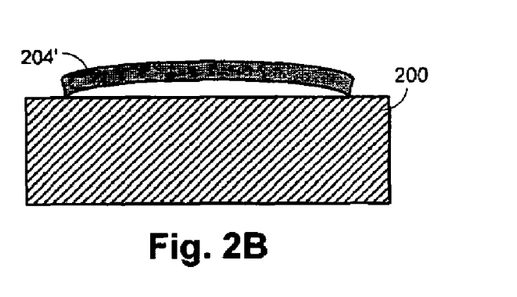

An illustration of the type of shape distortion that may result from such a deposition process is illustrated schematically with FIGS. 2A and 2B. As illustrated with the description of the structure shown in FIG. 1, fabrication processes of nitride structures may include a number of temperature changes and consistently take place at temperatures elevated from normal operational temperatures of the completed structures in addition to there being a lattice mismatch between sapphire and GaN, such materials have different coefficients of thermal expansion, causing differences in thermal expansion at different processing temperatures. This effect is generally even more significant than the lattice mismatch in causing shape distortions. The effect is illustrated schematically in FIGS. 2A and 2B. In these drawings, element 200 is a substrate holder, over which the structure 204 being fabricated is disposed. The two drawings are at different points in time during a fabrication process, with FIG. 2B corresponding to a later time than FIG. 2A and at a lower temperature than FIG. 2A. Such a sequence may occur in a variety of different fabrication processes for nitride structures. In the specific case of the structure shown in FIG. 1, for example, FIG. 2A may correspond to a point in time during epitaxy of the n-GaN layer 112 when the temperature is about 1050° C. and FIG. 2B may correspond to a point in time during growth of the InGaN active region 116 when the temperature is about 750° C. Notably, FIG. 2B could also correspond to a point in time after the entire structure has been fabricated and cooled down to room temperature.

It is evident from the drawing that the structure 204' at the cooler temperature is deformed with a center that is bowed upwards when compared with the structure 204 at the higher temperature. This bowing results from the differential thermal expansion between GaN and sapphire. Deposition may occur with a flat geometry at the temperatures used for GaN growth as shown in FIG. 2A. But when the structure is subsequently cooled for deposition of the InGaN active region, the substrate center bows upwards and becomes somewhat cooler than the edges. This temperature nonuniformity over the surface of the structure results in a nonuniformity in indium distribution in the deposited InGaN, with indium-rich regions tending to form at the center of the substrate and indium-poor regions tending to form at the periphery of the substrate. In turn, this nonuniformity in indium distribution translates into wavelength and light-output variations for devices formed across the structure, limiting the scale-up of the process for producing these materials.

The magnitude of the bowing depends on such factors as the thickness of the substrate, the thickness of the GaN epitaxial layer, and the growth temperature. General trends have been observed in which the bowing is more pronounced with a larger-diameter substrate, with a thinner substrate, and with a thicker layer of deposited GaN, reflecting the fact that the differential in thermal expansion may be increased with either portion of the structure.

While illustrations of embodiments of the invention provided herein focus on applications for fabrication of nitride structures, it will be appreciated that the same techniques may be used for the fabrication of other structures that deposit layers over substrates having significantly different coefficients of thermal expansion. Specific reference to fabrication of nitride structures is accordingly intended to be illustrative rather than limiting.

2. Exemplary Substrate Processing System

Figure 3A:
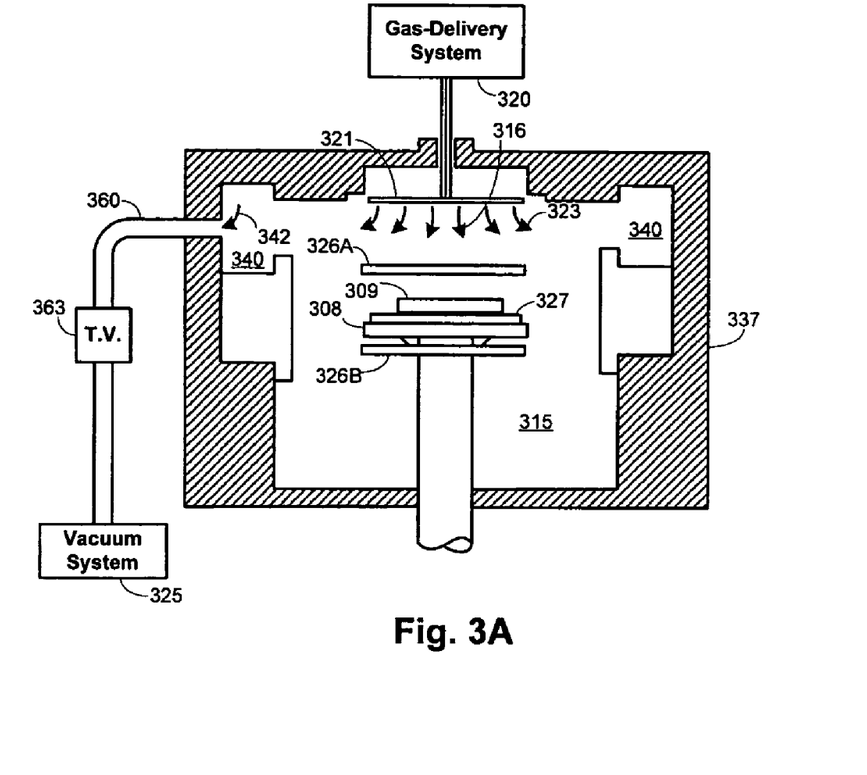
FIG. 3A is a simplified representation of an exemplary CVD apparatus that may be used in implementing certain embodiments of the invention.

FIG. 3A is a simplified diagram of an exemplary chemical vapor deposition ("CVD") system, illustrating the basic structure of a chamber in which individual deposition steps can be performed. This system is suitable for performing thermal, sub-atmospheric CVD ("SACVD") processes, as well as other processes, such as reflow, drive-in, cleaning, etching, deposition, and gettering processes. In some instances multiple-step processes can still be performed within an individual chamber before removal for transfer to another chamber. The major components of the system include, among others, a vacuum chamber 315 that receives process and other gases from a gas delivery system 320, a vacuum system 325, and a control system (not shown). These and other components are described in more detail below. While the drawing shows the structure of only a single chamber for purposes of illustration, it will be appreciated that multiple chambers with similar structures may be provided as part of a cluster tool, each tailored to perform different aspects of certain overall fabrication processes.

The CVD apparatus includes an enclosure assembly 337 that forms vacuum chamber 315 with a gas reaction area 316. A gas distribution structure 321 disperses reactive gases and other gases, such as purge gases, toward one or more substrates 309 held in position over a susceptor 327 by a substrate support structure 308. Between gas distribution structure 321 and the substrate 309 is gas reaction area 316. Different structures may be used for to heat the substrate 309 and/or susceptor 327. For instance, some embodiments of the invention advantageously use a pair of plates 326A and 326B in close proximity and disposed on opposite sides of the substrate support structure 308 to provide separate heating sources for the opposite sides of the susceptor 327. Merely by way of example, the plates 326A and 326B may comprise lamp heaters having a plurality of lamp elements that may be controlled separately or in subset groups. Such lamp heater arrangements are able to achieve temperatures greater than 1200° C., which may be useful for certain specific applications. As explained in greater detail below, the ability to control the lamp elements, either individually or as part of groups that define a subset of the total number of lamp elements, permits the application of nonuniform power that may be used in counteracting the effects of differences in coefficients of thermal expansion when depositing material.

Reactive and carrier gases are supplied from gas delivery system 320 through supply lines to the gas distribution structure 321. In some instances, the supply lines may deliver gases into a gas mixing box to mix the gases before delivery to the gas distribution structure. In other instances, the supply lines may deliver gases to the gas distribution structure separately, such as in certain showerhead configurations described below. Gas delivery system 320 includes a variety of gas sources and appropriate supply lines to deliver a selected amount of each source to chamber 315 as would be understood by a person of skill in the art. Generally, supply lines for each of the gases include shut-off valves that can be used to automatically or manually shut-off the flow of the gas into its associated line, and mass flow controllers or other types of controllers that measure the flow of gas or liquid through the supply lines. Depending on the process run by the system, some of the sources may actually be liquid sources rather than gases. When liquid sources are used, gas delivery system includes a liquid injection system or other appropriate mechanism (e.g., a bubbler) to vaporize the liquid. Vapor from the liquids is then usually mixed with a carrier gas as would be understood by a person of skill in the art. During deposition processing, gas supplied to the gas distribution structure 321 is vented toward the substrate surface (as indicated by arrows 323), where it may be uniformly distributed radially across the substrate surface in a laminar flow.

Purging gas may be delivered into the vacuum chamber 315 from gas distribution structure 321 and/or from inlet ports or tubes (not shown) through the bottom wall of enclosure assembly 337. Purge gas introduced from the bottom of chamber 315 flows upward from the inlet port past the heater 326 and to an annular pumping channel 340. Vacuum system 325 which includes a vacuum pump (not shown), exhausts the gas (as indicated by arrows 324) through an exhaust line 360. The rate at which exhaust gases and entrained particles are drawn from the annular pumping channel 340 through the exhaust line 360 is controlled by a throttle valve system 363.

The temperature of the walls of deposition chamber 315 and surrounding structures, such as the exhaust passageway, may be further controlled by circulating a heat-exchange liquid through channels (not shown) in the walls of the chamber. The heat-exchange liquid can be used to heat or cool the chamber walls depending on the desired effect. For example, hot liquid may help maintain an even thermal gradient during a thermal deposition process, whereas a cool liquid may be used to remove heat from the system during other processes, or to limit formation of deposition products on the walls of the chamber. Gas distribution manifold 321 also has heat exchanging passages (not shown). Typical heat-exchange fluids water-based ethylene glycol mixtures, oil-based thermal transfer fluids, or similar fluids. This heating, referred to as heating by the "heat exchanger", beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The system controller controls activities and operating parameters of the deposition system. The system controller may include a computer processor and a computer-readable memory coupled to the processor. The processor executes system control software, such as a computer program stored in memory. The processor operates according to system control software (program), which includes computer instructions that dictate the timing, mixture of gases, chamber pressure, chamber temperature, microwave power levels, pedestal position, and other parameters of a particular process. Control of these and other parameters is effected over control lines that communicatively couple the system controller to the heater, throttle valve, and the various valves and mass flow controllers associated with gas delivery system 320.

Figure 3B:
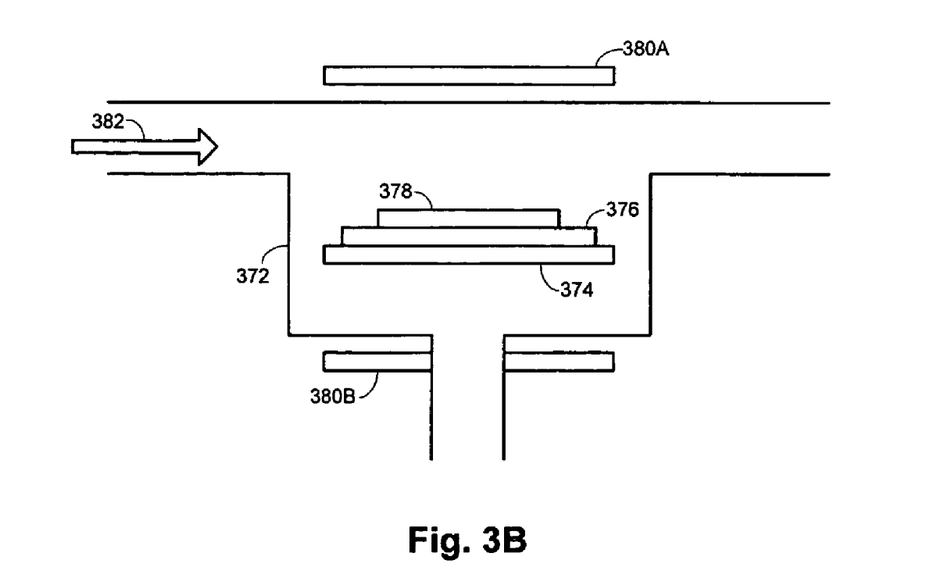
FIG. 3B is a schematic illustration of an alternative CVD apparatus that may be used in other embodiments of the invention.

The invention is not limited to use of structures like that shown in FIG. 3A. For instance, the structure shown in FIG. 3B illustrates one of several alternative structures that may be used in providing a substrate processing system to implement embodiments of the invention. This structure provides an example of a cross-flow reactor 372 in which a flow of gas 382 s provided in a direction substantially parallel to a plane of a substrate 378 over which material is to be deposited. The substrate 378 is supported over a susceptor 376 by a substrate support structure 374. Heater plates 380A and 380B enable the susceptor 376 to be heated in a nonuniform fashion, such as by use of lamp heater arrays having elements that may be controlled individually or as part of subset groups of lamp elements.

Figure 4:
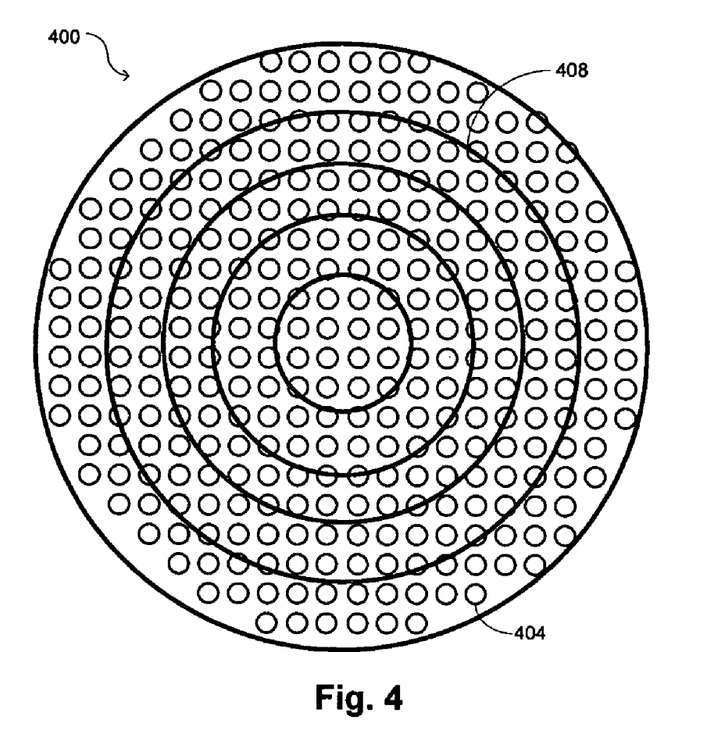
FIG. 4 is a schematic illustration of a structure of a lamp array that may be used for nonuniform heating of substrates during deposition.

FIG. 4 provides a schematic illustration of a structure that may be used for the heater plates 326A and 326B of FIG. 3A or heater plates 380A and 380B of FIG. 3B when implemented as a lamp array. In FIG. 4, the lamp array is denoted generally by reference number 400 and comprises a plurality of distributed lamp elements 408. Each lamp element 408 is configured to generate heat in the form of infrared light that is radiatively applied to the susceptor or substrate. The drawing shows a number of annular regions defined by rings 408 that separate areas having different radial distances from the center of the array 400. In applications where the array is to apply a radially varying power distribution, each lamp element 404 within a given annular region may apply substantially the same power, with the lamp elements of different annular regions applying different powers. This achieves a discretized manifestation of an idealized continuously varying power distribution. In some instances, the lamp array 400 may incorporate reflectors that concentrate or otherwise direct the radiative energy.

There are a number of variations to this basic design that may be implemented in different embodiments. For example, in one embodiment, the annular rings of lamps elements 404 are provided on different planes rather than being distributed in a substantially coplanar configuration. In another embodiment, the radial variation is at least partly achieved by appropriate shapes and configurations of the reflectors. The reflectors may direct heat preferentially to the center or edge of the substrate to achieve the radial variation. This permits the number of annular rings to be reduced and, in one embodiment, only a single annular ring is used, with the reflector shapes and configurations being used to achieve the desired radial temperature distribution.

The use of a radially varying power distribution is anticipated to be most widely useful because of the generally cylindrical symmetry of the substrate bowing that results from differences in thermal expansion of different materials. But the invention is not limited to the application of such radial variations. The ability to control individual lamp elements 408 in a more dynamic fashion permits the implementation of power distributions having with a second degree of freedom in addition to the radial variation. Variations using two degrees of freedom over the substrate plane may accordingly be implemented in certain specialized applications.

3. Exemplary Embodiments

In addition to the radial and potentially other spatial power distribution applied by the lamp array or other heater structure, embodiments of the invention make use of temporal variations in the power distribution. This may be realized by changing the spatial distribution of heat applied by the lamp array or other heater structure in concert with changes in processing temperature as different materials are deposited in fabricating a structure.

Figure 5:
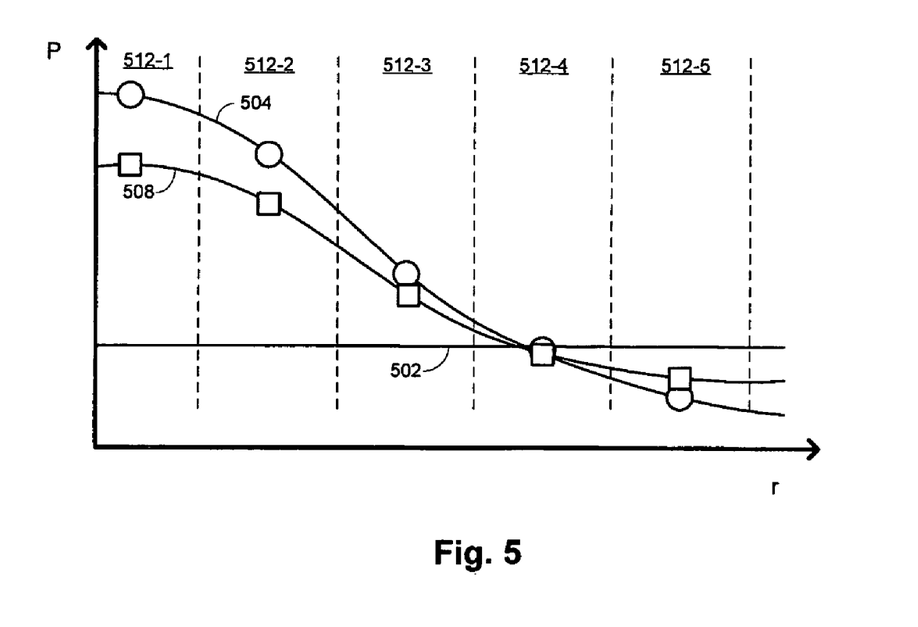
FIG. 5 provides a graphical illustration of different radial power dependencies that may be implemented with the lamp array in providing nonuniform substrate heating.

FIG. 5 provides an illustration of the type of radial distributions that may be used in different processes or in different stages of a single process. The drawing provides a plot of lamp power P versus radial distance r from a center of the heater structure, the center of the heater structure corresponding approximately to the center of the susceptor or substrate. Drawn primarily for purposes of comparison is a constant baseline distribution 502 that provides the same power to across the heater structure, such as by applying the same power to every lamp element of the array. Although this curve is included to permit a comparison with other distributions, there are instances in which uniform heating may be desired so that this is an example of an actual distribution that may sometimes be used.

Curves 504 and 508 show examples of radially varying power distributions. In applications involving the deposition of nitride layers, the specific thermal-expansion properties of the materials generally result in a deformation of the substrate that causes in to bow upwards in the center, as illustrated in FIG. 2B. In such instances, it is generally preferable that the radially varying power distribution of the heater structure apply more power to the center of the substrate than to the edges. This provides more heat to the portion of the substrate that is no longer in contact with the susceptor. The receipt of more lamp power compensates for the lack of thermal contact with the susceptor and thereby mitigating the tendency for the structure to bow. In addition to mitigating the tendency for the structure to bow, the application of more power at the center of the substrate tends to equalize the temperature across the substrate, which is ultimately manifested by improved consistency in the characteristics of devices fabricated from the deposited structures. In particular, when light-emitted devices are fabricated, the emission wavelengths of the devices tend to be more uniform as a result of greater uniformity in the distribution of active regions that results from the improved temperature uniformity.

Both curves 504 and 508 illustrate power distributions that apply more power at the substrate center than at the substrate edge. During a given fabrication process, there may be a shift from one of these distributions to another of these distributions. For instance, in the fabrication of a nitride structure that has an active-region InGaN layer deposited at about 750° C.

over an n-GaN layer deposited at about 1050° C., it may be appropriate to apply distribution 504 during the higher-temperature n-GaN deposition and to apply distribution 508 during the lower-temperature InGaN deposition. Such changes in power distribution of the heater structure may be included as part of a recipe applied automatically during a fabrication process.

FIG. 5 also illustrates that the manner in which the power distribution is implemented may be discretized. This discretization is accomplished by defining annular regions 512, with all lamp elements within a given annular region applying the same power. The actual applied power for each region is indicated with the circles and squares respectively overlying continuous distributions 504 and 508. Thus, for instance, in a center region of the substrate, a power defined by circle or square in region 512-1 may be applied by all lamp elements within that region 512-1; in the annular region 512-2 immediately outside the center region 512-1, a power defined by the circle or square in that region may be applied by all lamp elements within that region 512-2; and so forth. The illustration of five defined regions in FIGS. 4 and 5 is not intended to be limiting and other applications may use fewer regions or more regions depending on the specific complexities of individual applications. The desired continuous distribution may be most closely approximated by applying a power to a given lamp element defined by its distance from the center of the lamp array.

Furthermore, although FIG. 5 shows distinct radial distributions that might be used at specific temperatures, the transition between these distinct distributions during temperature changes may sometimes be substantially continuous. For example, if a process uses curve 504 at temperature $T_1$ and curve 508 at temperature $T_2$, a transition during the process from $T_1$ to $T_2$ may use a smooth change in power as the process temperature changes. This may avoid the influence of temperature nonuniformities that might otherwise result from abrupt changes in heater power coupled with smooth changes in overall temperature within the processing chamber.

In addition, while the foregoing description of suitable power distributions has used an example in which center power is greater than edge power, this will not always be the case. There may be processes in which the thermal-expansion characteristics are inverted from what has been described above, and in which edge power is preferably greater than center power in accommodating the differences in thermal expansion of layers. Embodiments of the invention thus also encompass the use of radially increasing powers in addition to the radially decreasing powers illustrated in the drawing. In certain specialized applications, the radial dependence of the power may also be nonmonotonic and, as previously noted, some specialized applications may also use powers that vary in nonradial distributions across the substrate.

Figure 6:
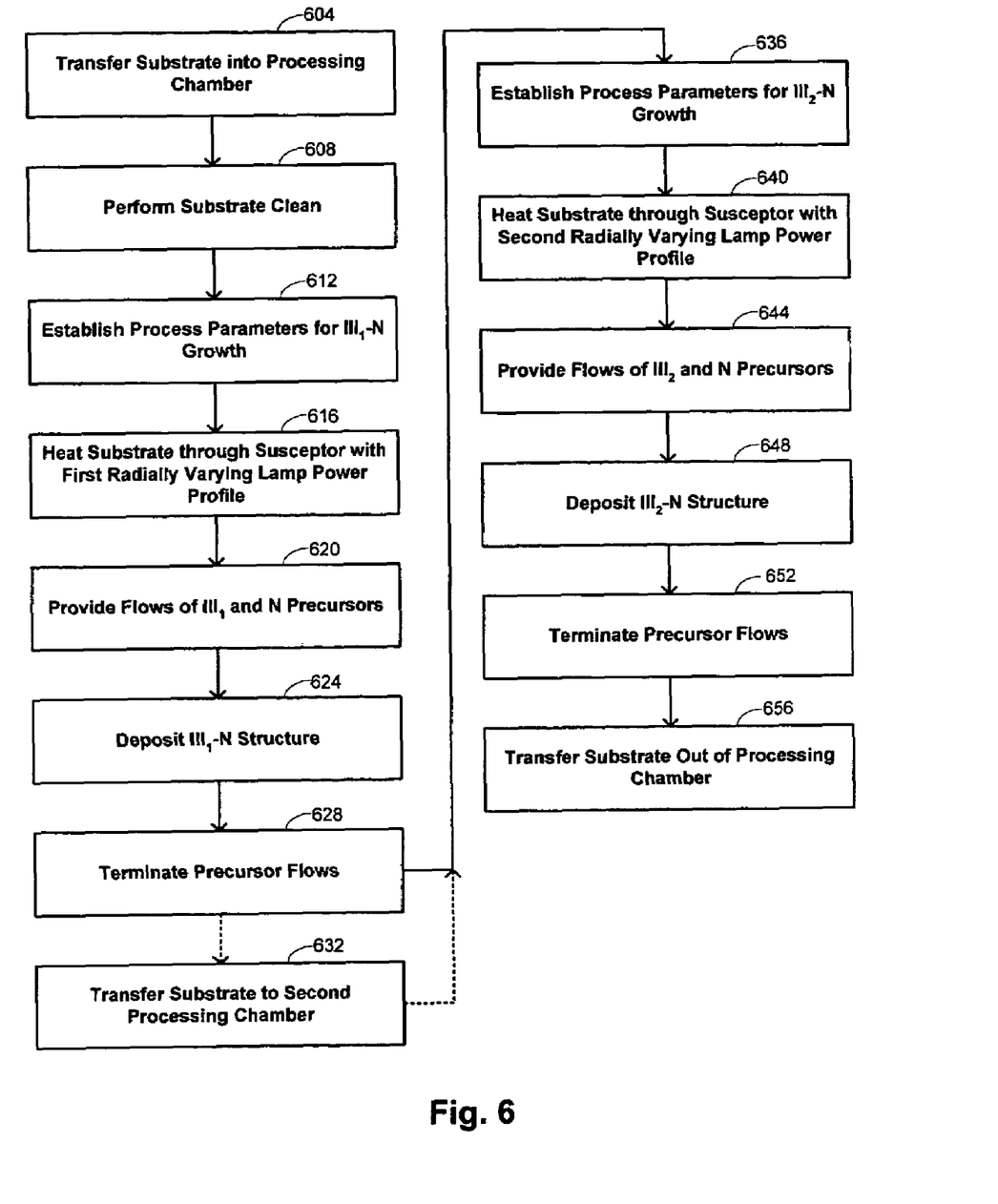
FIG. 6 is a flow diagram that summarizes methods for fabricating structures using nonuniform substrate heating.

FIG. 6 provides a flow diagram that illustrates a specific process for fabrication of a nitride semiconductor structure to illustrate the application of nonuniform heater power. The process begins at block 604 by transferring a substrate into a substrate processing chamber. For deposition of a nitride structure, the substrate may comprise sapphire, although other materials that may be used include SiC, Si, spinel, lithium gallate, ZnO, and others. The substrate is cleaned at block 608, after which process parameters suitable for growth of a nitride layer may be established at block 612. Such process parameters may include temperature, pressure, and the like to define an environment within the processing chamber appropriate for thermal deposition of a nitride layer. As indicated at block 616, the substrate is heated through a susceptor with a first radially varying lamp-power profile. For instance, this first profile could correspond to curve 504 of FIG. 5 or deposition to take place at about 1050° C. to deposit a GaN layer.

Flows of precursors are provided at block 620 to deposit a $III_1$-N structure over the substrate at block 624. The precursors include a nitrogen source and a source for a first group-III element such as Ga or instance, suitable nitrogen precursors include $NH_3$ and suitable Ga precursors include trimethyl gallium ("TMG"). The first group-III element may sometimes comprise a plurality of distinct group-III elements such as Al and Ga, in which case a suitable Al precursor may be trimethyl aluminum ("TMA"); in another example, the plurality of distinct group-III elements includes In and Ga, in which case a suitable In precursor may be trimethyl indium ("TMI"). A flow of a carrier gas such as $N_2$ and/or $H_2$ may also be included.

After deposition of the $III_1$-N structure at block 624, the precursor flows are terminated at block 628. Subsequent deposition steps may be performed in the same processing chamber or may be performed in a different processing chamber, such as in applications that make use of a cluster tool. When such a cluster tool is used, individual processing chamber comprised by the cluster tool may be especially adapted for deposition of different types of layers, enabling the individual depositions to proceed more efficiently. Such processing may thus increase productivity as described in copending, commonly assigned U.S. patent application Ser. No. 11/404,516, entitled "EPITAXIAL GROWTH OF COMPOUND NITRIDE SEMICONDUCTOR STRUCTURES," filed by Sandeep Nijhawan et al., the entire disclosure of which is incorporated herein by reference for all purposes. When subsequent processing is to be performed in a separate processing chamber, the substrate is transferred to a second processing chamber at block 632.

Irrespective of whether deposition of a subsequent layer is performed in the same or a different processing chamber, process parameters are established for growth of a $III_2$-N layer at block 636. The substrate is heated through the susceptor using a second radially varying lamp power profile at block 640; this profile may differ from the first profile, particularly if the deposition of the $III_2$-N layer is to be performed at a different temperature. For instance, if the second deposition is to be performed at 750° C., the profile could correspond to curve 508 of FIG. 5. Flows of a second group-III precursor and a nitrogen precursor are provided at block 644 to deposit the $III_2$-N structure at block 648. In some instances, the $III_2$-N structure includes a group-III element that is not comprised by the $III_1$-N layer, although the $III_1$-N and $III_2$-N layers may additionally comprise a common group-III element. For instance, in the case where the $III_1$-N layer is GaN, the $III_2$-N layer may be an AlGaN layer or an InGaN layer. While these are examples in which the $III_2$-N layer has a ternary composition, this is not required by the invention and the $III_2$ layer may more generally include such other compositions as quaternary AlInGaN layers. Similarly, in the case where the $III_1$-N layer is AlGaN, the $III_2$-N layer may be an InGaN layer on an AlInGaN layer. Suitable precursors for deposition of the $III_2$-N layer may be similar to the precursors used for the $III_1$ layer, i.e. $NH_3$ is a suitable nitrogen precursor, TMG is a suitable gallium precursor, TMA is a suitable aluminum precursor, and TMI is a suitable indium precursor. A carrier case such a $N_2$ and/or $H_2$ may also be included.

After deposition of the second layer, the precursor flows are termination at block 652. This process may continue, with suitable processing parameters, suitable lamp power profiles, and suitable precursor flows being provided to progressively deposit more layers in forming the nitride semiconductor structure. Deposition of each layer may be performed in the same processing chamber or may be performed after transfer of the substrate to a different processing chamber. In some instances, various patterning and/or etching steps may additionally be performed in fabricating the structure. Once fabrication of the structure has been completed, the substrate is transferred out of the processing chamber at block 656.

The processing conditions used for deposition of the $III_1$-N and $III_2$-N layers may vary depending on specific applications. The following table provides exemplary processing conditions and precursor flow rates that are generally suitable in the growth of nitride semiconductor structures using the devices described above:

| Parameter | Value |
|---|---|
| Temperature (° C.) | 500-1500 |
| Pressure (torr) | 50-1000 |
| TMG flow (sccm) | 0-50 |
| TMA flow (sccm) | 0-50 |
| TMI flow (sccm) | 0-50 |
| $PH_3$ flow (sccm) | 0-1000 |
| $AsH_3$ flow (sccm) | 0-1000 |
| $NH_3$ flow (sccm) | 100-100,000 |
| $N_2$ flow (sccm) | 0-100,000 |
| $H_2$ flow (sccm) | 0-100,000 |

As will be evident from the preceding description, a process might not use flows of all the precursors in any given process. For example, growth of GaN might use flows of TMG, $NH_3$, and $N_2$ in one embodiment; growth of AlGaN might use flows of TMG, TMA, $NH_3$, and $H_2$ in another embodiment, with the relative flow rates of TMA and TMG selected to provide a desired relative Al:Ga stoichiometry of the deposited layer; and growth of InGaN might use flows of TMG, TMI, $NH_3$, $N_2$, and $H_2$ in still another embodiment, with relative flow rates of TMI and TMG selected to provide a desired relative In:Ga stoichiometry of the deposited layer.

Because the shape deformities are largely or completely avoided by use of a radially varying heater profile, the fabrication process achieves improved device characteristics. For example, when an InGaN quantum-well active region is deposited over a GaN layer, the active region has improved alloy-composition uniformity that results from a more constant surface temperature across the substrate. The wavelength and power output of fabricated devices are thus also more uniform, improving the overall yield. Lithographic processing of the substrate into LED or laser-diode chips is simplified because the patterning is performed on a flatter surface, avoiding complications that result from implementing either contact or projection lithography on a curved surface.

Having fully described several embodiments of the present invention, many other equivalent or alternative methods of producing the cladding layers of the present invention will be apparent to those of skill in the art. These alternatives and equivalents are intended to be included within the scope of the invention, as defined by the following claims.

What is claimed is:

1. A method of fabricating a compound nitride semiconductor structure, the method comprising:

disposing a substrate over a susceptor in a processing chamber, wherein the susceptor is in thermal communication with the substrate;

flowing a first group-III precursor and a first nitrogen precursor into the processing chamber, the first group-III precursor comprising a first group-III element;

heating the susceptor with a first nonuniform temperature profile to heat the substrate while flowing the first group-III precursor and the first nitrogen precursor, wherein heating the susceptor with a first nonuniform temperature profile comprises heating a center of the susceptor to a temperature greater than an edge of the susceptor; and depositing a first nitride layer over the heated substrate with a thermal chemical vapor deposition process within the processing chamber using the first group-III precursor and the first nitrogen precursor.

2. The method recited in claim 1 further comprising, after depositing the first nitride layer:

flowing a second group-III precursor and a second nitrogen precursor into the processing chamber, the second group-III precursor comprising a second group-III element;

heating the susceptor with a second nonuniform temperature profile to heat the substrate while flowing the second group-III precursor and the second nitrogen precursor; and depositing a second nitride layer over the first nitride layer and over the heated substrate with a thermal chemical vapor deposition process within the processing chamber using the second group-III precursor and the second nitrogen precursor.

3. The method recited in claim 2 wherein:

the second group-III element is different from the first group-III element;

the second nitride layer has a different coefficient of thermal expansion than the first nitride layer; and the second nonuniform temperature profile is different from the first nonuniform temperature profile.

4. The method recited in claim 3 wherein heating the susceptor with the second nonuniform temperature profile comprises smoothly changing the first nonuniform temperature profile to the second nonuniform temperature profile.

5. The method recited in claim 3 wherein:

the first group-III element is gallium;

the second group-III element is aluminum;

the first nitride layer comprises a GaN layer; and the second nitride layer comprises an AlGaN layer.

6. The method recited in claim 3 wherein:

the first group-III element is gallium;

the second group-III element is indium;

the first nitride layer comprises a GaN layer; and the second nitride layer comprises an InGaN layer.

7. The method recited in claim 3 wherein:

the first group-III element is gallium;

the second group-III element includes aluminum and indium;

the first nitride layer comprises a GaN layer; and the second nitride layer comprises an AlInGaN layer.

8. The method recited in claim 1 further comprising flowing a carrier gas with the first group-III precursor and the first nitrogen precursor, wherein the carrier gas is selected from the group consisting of $N_2$ and $H_2$.

9. The method recited in claim 1 wherein the substrate and the first nitride layer have different coefficients of thermal expansion.

10. The method recited in claim 1 wherein the substrate is selected from the group consisting of a sapphire substrate, a SiC substrate, a silicon substrate, a spinel substrate, a lithium gallate substrate, and a ZnO substrate.

11. The method recited in claim 1 wherein heating the susceptor comprises radiatively heating the susceptor with a lamp array, the lamp array comprising a plurality of radiative lamp elements.

12. The method recited in claim 11 wherein heating the susceptor comprises:
    activating each of the lamp elements within a first annular region of the lamp array with a first power; and
    activating each of the lamp elements within a second annular region of the lamp array different from the first annular region with a second power, wherein the second power is different from the first power.

13. The method recited in claim 12 wherein heating the susceptor comprises selectively directing heat from the lamp elements to different portions of the susceptor with a reflector configuration.

14. A method of fabricating a structure, the method comprising:
    disposing a substrate over a susceptor in a processing chamber, wherein the susceptor is in thermal communication with the substrate;
    flowing a first process gas into the processing chamber, the first process gas including precursors for growth of a first layer over the substrate, wherein the substrate and the first layer have different coefficients of thermal expansion;
    heating the susceptor with a first nonuniform temperature profile to heat the substrate while flowing the first process gas, wherein heating the susceptor with a first nonuniform temperature profile comprises heating a center of the susceptor to a temperature greater than an edge of the susceptor; and
    depositing the first layer over the heated substrate with a thermal chemical vapor deposition process within the processing chamber using the first process gas.

15. The method recited in claim 14 further comprising, after depositing the first layer:
    flowing a second process gas into the processing chamber, the second process gas including precursors for growth of a second layer over the first layer, wherein the first layer and second layer have different coefficients of thermal expansion;
    heating the susceptor with a second nonuniform temperature profile different from the first nonuniform temperature profile to heat the substrate while flowing the second process gas; and
    depositing the second layer over the first layer and over the heated substrate with a thermal chemical vapor deposition process within the processing chamber using the second process gas.

16. The method recited in claim 15 wherein heating the susceptor with the second nonuniform temperature profile comprises smoothly changing the first nonuniform temperature profile to the second nonuniform temperature profile.

17. The method recited in claim 14 wherein heating the susceptor comprises radiatively heating the susceptor with a lamp array, the lamp array comprising a plurality of radiative lamp elements.

18. The method recited in claim 17 wherein heating the susceptor comprises:
    activating each of the lamp elements within a first annular region of the lamp array with a first power; and
    activating each of the lamp elements within a second annular region of the lamp array different from the first annular region with a second power, wherein the second power is different from the first power.

19. A method of fabricating compound nitride semiconductor structure, the method comprising:
    disposing a sapphire substrate over a susceptor in a processing chamber, wherein the susceptor is in thermal communication with the sapphire substrate;
    flowing a first process gas into the processing chamber, the first process gas comprising a gallium precursor, a nitrogen precursor, and a carrier gas selected from the group consisting of N2 and H2;
    radiatively heating the susceptor with a lamp array comprising a plurality of radiative lamp elements to provide a first nonuniform temperature profile across the susceptor and thereby heat the sapphire substrate while flowing the first process gas, wherein the first nonuniform temperature profile provides a temperature decreasing monotonically from a center of the susceptor over a plurality of annular regions towards an edge of the susceptor;
    depositing a GaN layer over the heated sapphire substrate with a thermal chemical vapor deposition process within the processing chamber using the first process gas, wherein the sapphire substrate and the GaN layer have different coefficients of thermal expansion;
    thereafter, flowing a second process gas into the processing chamber, the second process gas comprising a group-III precursor, a nitrogen precursor, and a carrier gas selected from the group consisting of $N_2$ and $H_2$, wherein the group-III precursor comprises a group-III element different from gallium;
    radiatively heating the susceptor with the lamp array to provide a second nonuniform temperature profile across the susceptor and thereby heat the sapphire substrate while flowing the second process gas, wherein the second nonuniform temperature profile is different from the first nonuniform temperature profile and provides a temperature decreasing monotonically from the center of the susceptor over the plurality of annular regions towards the edge of the susceptor; and
    depositing a nitride layer over the GaN layer with a thermal chemical vapor deposition process within the processing chamber using the second process gas, wherein the GaN layer and the nitride layer have different coefficients of thermal expansion.

* * * * *